United States Patent [19]
Cho et al.

[11] Patent Number: 6,001,719
[45] Date of Patent: Dec. 14, 1999

[54] METHODS OF FORMING METAL SILICIDE LAYERS HAVING INSULATOR-FILLED RECESSES THEREIN

[75] Inventors: Kwang-lae Cho, Seoul; Jin-gyoo Choi, Kyungki-do, both of Rep. of Korea

[73] Assignee: Samsung Electronics Co., Ltd., Rep. of Korea

[21] Appl. No.: 08/957,301

[22] Filed: Oct. 24, 1997

[30] Foreign Application Priority Data

Oct. 24, 1996 [KR] Rep. of Korea ............... 96-48134

[51] Int. Cl.⁶ ............... H01L 21/3205; H01L 21/4763; H01L 21/305
[52] U.S. Cl. ............... 438/592; 438/595; 438/704; 438/906; 438/974
[58] Field of Search ............... 438/592, 595, 438/704, 906, 974

[56] References Cited

U.S. PATENT DOCUMENTS 4,285,761 8/1981 Fatula, Jr. et al. .
5,262,352 11/1993 Woo et al. .
5,491,100 2/1996 Lee et al. .
5,541,131 7/1996 Yoo et al. .
5,811,335 9/1998 Santangelo et al. .

OTHER PUBLICATIONS

Mayer, James W.; Electronic Materials Science: For Integrated Circuits in Si and GaAs; Oxidation of Silicides, pp. 294–295, 1990.

*Primary Examiner*—Richard Booth
*Assistant Examiner*—Ron Pompey
*Attorney, Agent, or Firm*—Myers Bigel Sibley & Sajovec

[57] ABSTRACT

Methods of forming metal silicide layers include the steps of forming electrically conductive lines that comprise the steps of forming a layer of polysilicon on a semiconductor substrate and then forming a layer of metal silicide on the polysilicon layer, opposite the substrate. The layer of metal silicide and the layer of polysilicon are then patterned as an electrically conductive line having sidewalls. The semiconductor substrate is then exposed to a cleaning agent that selectively etches the patterned layer of metal silicide at a faster rate than the patterned layer of polysilicon. The patterned layer of metal silicide is then thermally oxidized to define recess spacers extending adjacent sidewalls of the electrically conductive line. An electrically insulating layer is then formed on the electrically conductive line and on the recess spacers. The electrically insulating layer is then anisotropically etched to define insulating spacers on the recess spacers. These recess spacers reduce the likelihood that any subsequent reduction in size of the patterned metal silicide layer will cause the formation of voids in the insulating spacers and electrical shorts between the metal silicide layer and adjacent regions. In addition, according to one embodiment of the present invention, the thermally oxidizing step comprises thermally oxidizing the patterned layer of metal silicide at a faster rate than the patterned layer of polysilicon. Preferably, the oxidizing step comprises thermally oxidizing the patterned layer of metal silicide at a temperature of greater than about 800° C.

7 Claims, 2 Drawing Sheets

METHODS OF FORMING METAL SILICIDE LAYERS HAVING INSULATOR-FILLED RECESSES THEREIN

FIELD OF THE INVENTION

The present invention relates to methods of forming integrated circuits, and more particularly to methods of forming conductive layers on integrated circuit substrates.

BACKGROUND OF THE INVENTION

As the integration density of a semiconductor device increases, the importance of low-resistance wiring increases. Currently, a polycide structure wherein refractory metal silicide layers are stacked on a polysilicon layer has been widely used as a low-resistance wiring structure for a bit line, a gate electrode, etc. When the polycide structure is used for a gate electrode, voids may be generated within an interlayer insulating layer formed in a subsequent step due to shrinkage of the silicide material, such as tungsten silicide or titanium silicide, and thus electrical shorts may occur between adjacent landing pads.

Hereinafter, a method for fabricating a conventional polycide gate electrode will be described with reference to FIGS. 1A through 1D. FIG. 1A is a sectional view showing the step of forming a gate pattern comprising a polysilicon layer pattern 20, a silicide layer pattern 25 and a mask oxide layer pattern 30 on a semiconductor substrate 10 on which a gate oxide layer 15 is formed. A low temperature oxide (LTO) is generally used as the mask oxide layer pattern 30.

FIG. 1B is a cross-sectional view showing the gate pattern which is deformed through a cleaning process for removing polymer (not shown) generated on the face of the exposed semiconductor substrate and the surface of the gate pattern during an etching process for forming the gate pattern. At this time, the suicide layer pattern 25 of FIG. 1A is partially removed through the cleansing process resulting in a silicide layer pattern 25a whose right and left sides are recessed.

FIG. 1C is a sectional view showing the step of forming an interlayer insulating layer 35 on the entire surface of the resultant structure on which the cleaning process is performed. Here, the interlayer insulating layer 35 is typically formed of a high-temperature oxide (HTO). During formation of the high-temperature oxide, the silicide material may become crystallized and the volume thereof may shrink. Therefore, the silicide layer pattern 25a of FIG. 1B may become deformed and result in a reduced silicide layer pattern 25b of FIG. 1C. The shrinking of the silicide material may also cause voids 40 to be generated in portions of the interlayer insulating layer 35 extending adjacent to the silicide layer pattern 25b.

FIG. 1D is a sectional view showing the steps of forming a contact hole by a self-aligned contact method using a gate spacer 35a as a mask, and forming a landing pad 45 by filling the contact hole with a conductive material. Here, the gate spacer 35a is formed by anisotropically etching the interlayer insulating layer 35 of FIG. 1C so that a predetermined portion of the semiconductor substrate between adjacent gate electrodes is exposed. Meanwhile, the voids 40 of FIG. 1C are partially etched when the interlayer insulating layer 35 of FIG. 1C is anisotropically etched, thereby forming grooves 40a in the gate spacer 35a. These grooves 40a take the form of elongated grooves along the surface of gate spacer 35a and are typically filled with a conductive material when the conductive material is deposited on the exposed semiconductor substrate 10 to form the landing pad 45.

However, the conductive material filling the grooves 40a may remain even after the landing pad 45 is patterned to expose portions of the filled grooves extending in a third dimension not shown. Thus, parasitic conductive bridges may be formed between adjacent devices. As a result, failure of the semiconductor device may occur.

SUMMARY OF THE INVENTION

It is therefore an object of the present invention to provide improved methods of forming integrated circuits that are less susceptible to parasitic electrical shorts.

It is another object of the present invention to provide electrically conductive lines that contain metal silicide layers therein.

It is still another object of the present invention to provide methods of forming integrated circuits that are less susceptible to void formation and defects caused thereby.

These and other objects, advantages and features of the present invention are provided by methods of forming electrically conductive lines (e.g., gate electrodes) that comprise the steps of forming a layer of polysilicon on a semiconductor substrate and then forming a layer of metal silicide on the polysilicon layer, opposite the substrate. The layer of metal silicide and the layer of polysilicon are then patterned as an electrically conductive line having sidewalls. The semiconductor substrate is then exposed to a cleaning agent that selectively etches the patterned layer of metal silicide at a faster rate than the patterned layer of polysilicon. The patterned layer of metal silicide is then thermally oxidized to define recess spacers extending adjacent sidewalls of the electrically conductive line. An electrically insulating layer is then formed on the electrically conductive line and on the recess spacers. The electrically insulating layer is then anisotropically etched to define insulating spacers on the recess spacers. These recess spacers reduce the likelihood that any subsequent reduction in size of the patterned metal silicide layer during back-end processing will cause the formation of voids in the insulating spacers and electrical shorts between the metal silicide layer and adjacent regions. In addition, according to one embodiment of the present invention, the thermally oxidizing step comprises thermally oxidizing the patterned layer of metal silicide at a faster rate than the patterned layer of polysilicon. Preferably, the oxidizing step comprises thermally oxidizing the patterned layer of metal silicide at a temperature of greater than about 800° C.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 2A:
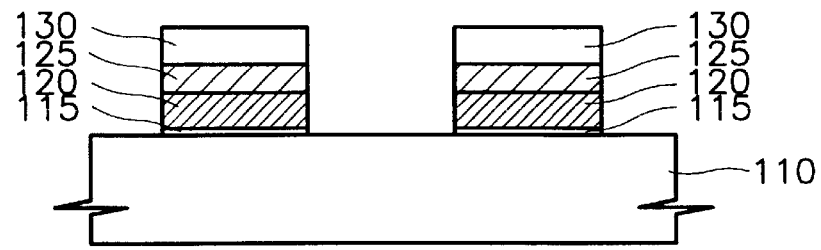
FIGS. 2A–2D are cross-sectional views of intermediate structures that illustrate a method of forming metal silicide layers having insulator-filled recesses therein, according to an embodiment of the present invention.

FIG. 2A is a sectional view showing the step of forming a gate pattern. Here, a gate oxide layer 115 is formed on a semiconductor substrate 110 using a typical method. Then, a polysilicon layer, a silicide layer and a mask layer are sequentially stacked on the gate oxide layer 115. Next, a mask layer pattern 130 defining a gate pattern is formed using conventional patterning techniques, thereby exposing a predetermined portion of the silicide layer. A silicide layer pattern 125 and a polysilicon layer pattern 120 are then formed to expose a predetermined portion of the semiconductor substrate 110 by etching the suicide layer and the polysilicon layer and the gate oxide layer 115 using the mask layer pattern 130 as an etching mask. Thus, the gate pattern comprising the mask layer pattern 130, the silicide layer pattern 125 and the polysilicon layer pattern 120 is completed. The mask layer pattern 130 is preferably formed of an insulting material which can be formed at a temperature of 600° C. or less. For example, a low-temperature oxide may be used to form the mask layer pattern.

Figure 2B:
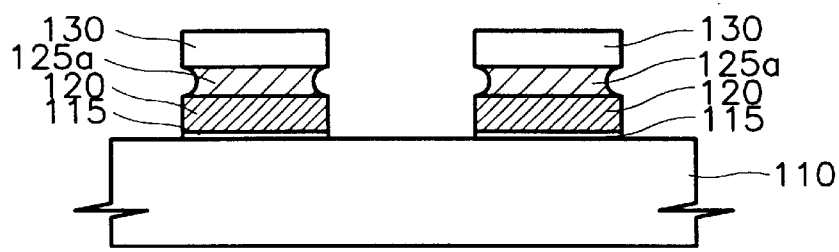

FIG. 2B is a sectional view showing the step of cleaning the surface of the resultant structure on which the gate pattern is formed. As shown in FIG. 2B, the cleaning process is performed to remove polymer (not shown) generated on the face of the exposed semiconductor substrate and the surface of the gate pattern during the etching process for forming the gate pattern. At this time, the silicide layer pattern 125 of FIG. 2A is partially removed through the cleaning process which results in a silicide layer pattern 125a whose left and right side surfaces are recessed.

Figure 1A:
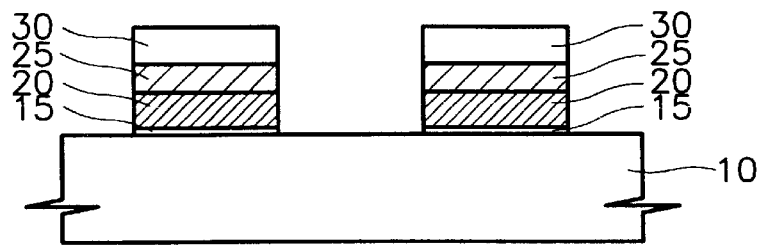
FIGS. 1A–1D are cross-sectional views of intermediate structures that illustrate a method of forming a polycide gate electrode according to the prior art.
Figure 1B:
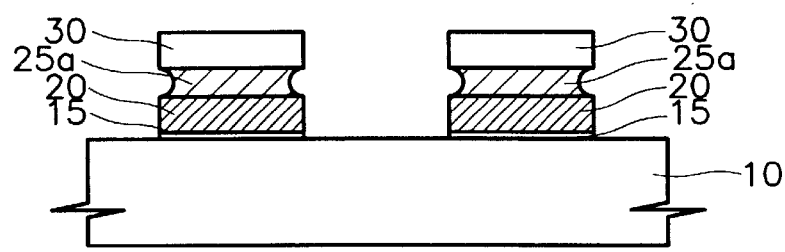
Figure 1C:
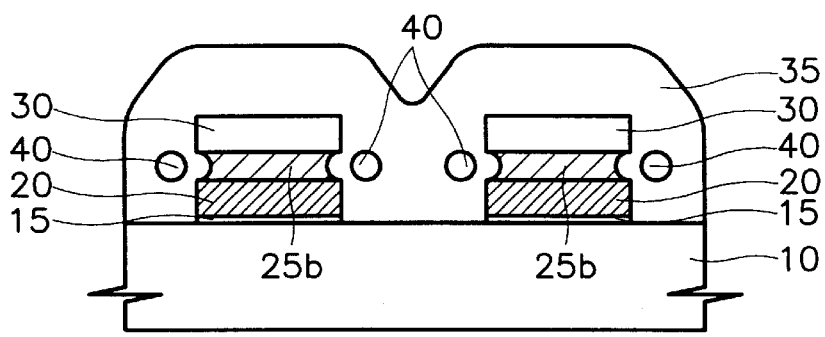
Figure 1D:
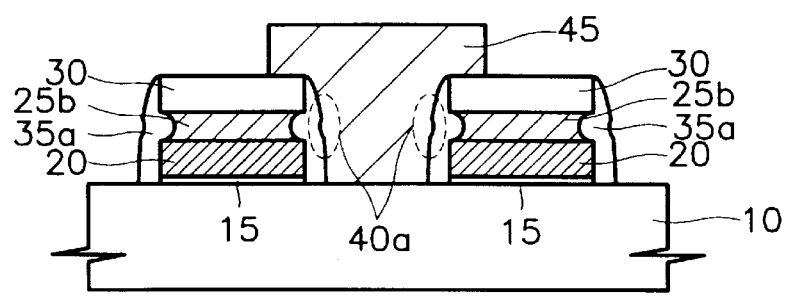
Figure 2C:
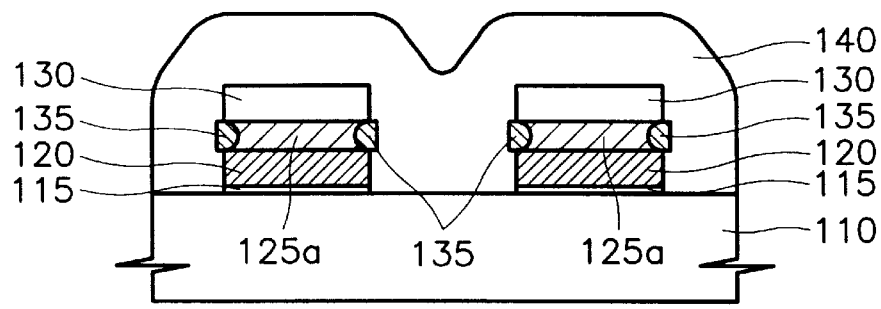

FIG. 2C is a sectional view showing the step of forming a shrinkage compensating oxide layer 135 (i.e., recessed spacer) and an interlayer insulating layer 140. In more detail, the shrinkage compensating oxide layer 135 is formed on both side surfaces of the reduced silicide layer pattern 125a by thermally oxidizing the gate pattern after the cleaning process. The thermal oxidation step is preferably carried out at a high-temperature, i.e., 800° C. or more. Then, the interlayer insulating layer 140 is formed on the entire surface of the resultant structure. Here, the fact that the thermal oxidation rate of the silicide layer pattern 125a is greater than that of the polysilicon layer pattern 120 allows for the formation of a shrinkage compensating oxide layer 135. Also, the thermal oxidation step may be carried out by varying thermal oxidation conditions, such as temperature, time or the amount of gas injected, so that the shrinkage compensating oxide layer 135 (i.e., recessed spacer) may be formed almost entirely on the recessed portion of the silicide layer pattern 125a. The shrinkage compensating oxide layer 135 fills the recessed portions of the silicide layer pattern 125a, and can prevent the voids 40 of FIG. 1C from being generated in the interlayer insulating layer 140. Therefore, generation of "bridges" that provide a conducting path between adjacent devices is prevented.

Figure 2D:
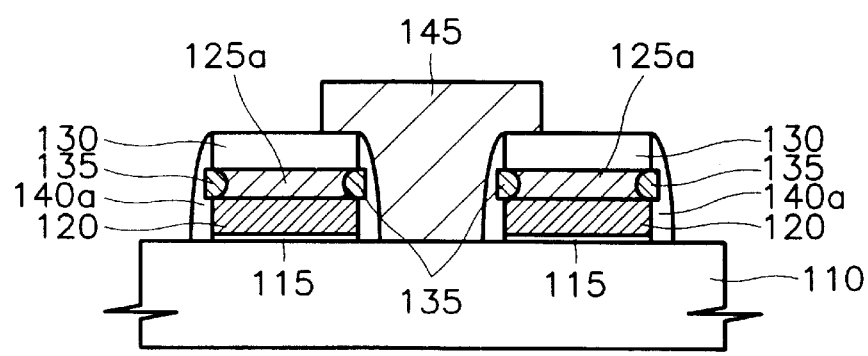

FIG. 2D is a sectional view showing the step of forming a spacer 140a and a landing pad 145. Here, the interlayer insulating layer 140 is anisotropically etched, so that the spacer 140a is formed on the sidewalls of the gate pattern and a predetermined portion of the semiconductor substrate between adjacent gate electrodes is exposed. Next, a conductive material, e.g., polysilicon, is deposited on the entire surface of the resultant structure and patterned, thereby forming the landing pad 145 having a predetermined shape. As described above, in the polycide gate electrode according to the present invention, a shrinkage compensating oxide layer (e.g., a high-temperature oxide) is formed on both side surfaces of the silicide layer pattern. The shrinkage compensating oxide layer fills recessed portions of the silicide layer pattern to prevent the generation of voids in the interlayer insulating layer, even though the silicide layer pattern may shrink during the process for fabricating the gate electrode. Therefore, bridges due to voids are not formed and shorts between adjacent devices are not formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrically conductive layer, comprising the steps of:

forming a metal silicide layer on a semiconductor substrate;

exposing the substrate and metal silicide layer to a cleaning solution that forms recesses in sidewalls of the metal silicide layer;

thermally oxidizing a recessed sidewall of the metal silicide layer to form a recessed spacer thereon;

forming an electrically insulating layer on the metal silicide layer and on the recessed spacer:

anisotropically etching the electrically insulating layer to define an electrically insulating spacer on the recessed spacer; and forming an electrically conductive layer on the electrically insulating spacer.

2. The method of claim 1, wherein said step of forming a metal silicide layer is preceded by the step of forming a polysilicon layer between the metal silicide layer and the semiconductor substrate; and wherein said exposing step comprises exposing the polysilicon layer and the metal silicide layer to a cleaning solution that selectively etches the metal silicide layer at a higher rate than the polysilicon layer.

3. The method of claim 2, wherein said thermally oxidizing step comprises thermally oxidizing a recessed sidewall of the metal silicide layer at a faster rate than the polysilicon layer.

4. The method of claim 3, wherein said thermally oxidizing step is performed at a temperature of greater than about 800° C.

5. A method of forming an electrically conductive layer, comprising the steps of:

forming a layer of polysilicon on a semiconductor substrate;

forming a layer of metal silicide on the polysilicon layer, opposite the substrate;

patterning the layer of metal silicide and the layer of polysilicon as an electrically conductive line having sidewalls;

cleaning the semiconductor substrate with a cleaning agent that selectively etches the patterned layer of metal silicide at a faster rate than the patterned layer of polysilicon;

thermally oxidizing the patterned layer of metal silicide to define recess spacers extending adjacent sidewalls of the electrically conductive line;

forming an electrically insulating layer on the electrically conductive line and on the recess spacers; and anisotropically etching the electrically insulating layer to define insulating spacers on the recess spacers.

6. The method of claim 5, wherein said thermally oxidizing step comprises thermally oxidizing the patterned layer of metal silicide at a faster rate than the patterned layer of polysilicon.

7. The method of claim 6, wherein said thermally oxidizing step comprises thermally oxidizing the patterned layer of metal silicide at a temperature of greater than about 800° C.

* * * * *